(12) United States Patent
Park et al.

(10) Patent No.: US 8,994,854 B2
(45) Date of Patent: Mar. 31, 2015

(54) CDS CIRCUIT, IMAGE SENSOR INCLUDING THE SAME, AND IMAGE PROCESSING DEVICE INCLUDING THE IMAGE SENSOR

(71) Applicant: Samsung Electronics Co., Ltd., Suwon-Si, Gyeonggi-Do (KR)

(72) Inventors: Yu Jin Park, Seoul (KR); Ji Min Cheon, Yongin-si (KR); Jin Ho Seo, Seoul (KR); Ji Hun Shin, Seoul (KR); Seog Heon Ham, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 117 days.

(21) Appl. No.: 13/771,409

(22) Filed: Feb. 20, 2013

(65) Prior Publication Data

US 2013/0215307 A1 Aug. 22, 2013

(30) Foreign Application Priority Data

Feb. 22, 2012 (KR) ........................ 10-2012-0017967

(51) Int. Cl.
*H04N 5/217* (2011.01)
*H04N 3/14* (2006.01)
*H03K 5/1252* (2006.01)
*H04N 5/378* (2011.01)

(52) U.S. Cl.
CPC ............ *H03K 5/1252* (2013.01); *H04N 5/378* (2013.01)
USPC ............................ 348/241; 348/294; 257/291

(58) Field of Classification Search
USPC .......... 348/241, 248, 302, 294; 257/291, 292; 250/208.1
See application file for complete search history.

(56) References Cited

U.S. PATENT DOCUMENTS

| | | | |
|---|---|---|---|
| 7,091,751 B2 | 8/2006 | Roh et al. | |
| 7,492,401 B2 | 2/2009 | Lim | |
| 7,535,398 B2 | 5/2009 | Lim et al. | |
| 7,864,229 B2 | 1/2011 | Lee et al. | |
| 7,919,993 B2 | 4/2011 | Keel et al. | |
| 2008/0308852 A1* | 12/2008 | Lee et al. | ...... 257/292 |
| 2009/0201403 A1 | 8/2009 | Kim et al. | |
| 2009/0212827 A1* | 8/2009 | Keel et al. | ........ 327/73 |
| 2011/0133966 A1 | 6/2011 | Ono | |
| 2012/0049042 A1* | 3/2012 | Lim et al. | ......... 250/208.1 |

FOREIGN PATENT DOCUMENTS

JP  2009-290439 A  12/2009
KR  2009-0117192 A  11/2009

* cited by examiner

*Primary Examiner* — Nhan T Tran
(74) *Attorney, Agent, or Firm* — Harness, Dickey & Pierce, P.L.C.

(57) ABSTRACT

A correlated double sampling (CDS) circuit includes a correction circuit configured to receive an input pixel signal through a first node via a column line, correct the input pixel signal, and output the corrected pixel signal through a second node; and a comparator including first and second input terminals, the first input terminal being connected to the second node and being configured to receive the corrected pixel signal, and the second input terminal configured to receive a ramp signal, the comparator being configured to compare the corrected pixel signal with the ramp signal and output a comparison signal indicating a result of the comparing, wherein the correction circuit includes, a first capacitor connected between the first and second nodes, and one or more metal lines disposed adjacent to the first capacitor, and wherein at least one other capacitor is formed by the first capacitor and the metal line.

20 Claims, 7 Drawing Sheets

CDS CIRCUIT, IMAGE SENSOR INCLUDING THE SAME, AND IMAGE PROCESSING DEVICE INCLUDING THE IMAGE SENSOR

CROSS-REFERENCE TO RELATED APPLICATIONS

This application claims priority under 35 U.S.C. §119 to Korean Patent Application No. 10-2012-0017967, filed on Feb. 22, 2012, in the Korean Intellectual Property Office, the disclosure of which is incorporated herein in its entirety by reference.

BACKGROUND

1. Field

An example embodiment relates to image sensors, and more particularly, to a correlated double sampling (CDS) circuit capable of minimizing a signal loss, an image sensor including the same, and an image processing device including the image sensor.

2. Related Art

An image sensor is a device that transforms an optical image signal into an electrical image signal. The image sensor includes a CDS circuit to reduce fixed pattern noise (FPN) and reset noise.

When an output terminal of a pixel array and an input terminal of the CDS circuit are connected in series via a capacitor, the CDS circuit forms a ground shielding layer to prevent coupling from occurring between adjacent column lines or signals. However, a parasitic capacitor may exist in the CDS circuit, thereby causing a signal loss to occur.

SUMMARY

According to an example embodiment, a correlated double sampling (CDS) may include a correction circuit configured to receive an input pixel signal through a first node via a column line, correct the input pixel signal, and output the corrected pixel signal through a second node; and a comparator including a first input terminal and a second input terminal, the first input terminal being connected to the second node and being configured to receive the corrected pixel signal, and the second input terminal configured to receive a ramp signal, the comparator being configured to compare the corrected pixel signal with the ramp signal and output a comparison signal indicating a result of the comparing. The correction circuit may include a first capacitor connected between the first and second nodes, and one or more metal lines disposed adjacent to the first capacitor, and the at least one other capacitor may be formed by the first capacitor and the metal line.

According to an example embodiment, the one or more metal lines may include a first metal line and a second metal line, the first and second metal lines being horizontally disposed adjacent to the first capacitor, and the first ends of the first and second metal lines, respectively, may be connected to a first end of the first capacitor, the first end of the first capacitor being connected to the first node.

The at least one other capacitor may include a second capacitor and a third capacitor. The second capacitor may be formed between a second end of the first capacitor and a second end of the first metal line, the second end of the first capacitor being connected to the second node. The third capacitor may be formed between the second end of the first capacitor and a second end of the second metal line.

The first capacitor may be connected in series between an output terminal of the column line and the first input terminal of the comparator.

The correction circuit configured to perform direct-current (DC) coupling on the input pixel signal received via the column line so as to remove reset noise.

According to an example embodiment, an image sensor may include a pixel array including a plurality of pixels; a corrected double sampling (CDS) circuit configured to perform CDS on an input pixel signal being respectively received from unit pixels connected to a column line of the pixel array, and output a result of the performing; and a ramp signal generator configured to generate a ramp signal. The CDS circuit may include a correction circuit configured to receive the input pixel signal through a first node via the column line, correct the input pixel signal, and then output the corrected pixel signal through a second node; and a comparator including a first input terminal and a second input terminal, the first input terminal being connected to the second node and being configured to receive the corrected pixel signal, and the second input terminal configured to receive the ramp signal, the comparator being configured to compare the corrected pixel signal with the ramp signal and output a comparison signal indicating a result of the comparing. The correction circuit may include a first capacitor connected between the first and second nodes; and one or more metal lines disposed adjacent to the first capacitor, wherein at least one other capacitor is formed by the first capacitor and the metal line.

According to an example embodiment, the one or more metal lines may include a first metal line and a second metal line, the first and second metal lines being horizontally disposed adjacent to the first capacitor, and the first ends of the first and second metal lines, respectively, may be connected to a first end of the first capacitor, the first end of the first capacitor being connected to the first node.

The at least one other capacitor may include a second capacitor and a third capacitor. The second capacitor may be formed between a second end of the first capacitor and a second end of the first metal line, the second end of the first capacitor being connected to the second node. The third capacitor may be formed between the second end of the first capacitor and a second end of the second metal line.

The image sensor may further include an analog-to-digital converter configured to receive an output signal of the CDS circuit and the ramp signal. The CDS circuit may be included inside the analog-to-digital converter.

The analog-to-digital converter may be a column parallel single slope analog-to-digital converter.

According to an example embodiment, there is provided an image processing device including the image sensor and a processor configured to control operations of the image sensor.

The image processing device may be a mobile phone, a tablet personal computer, or a digital single-lens reflex (DSLR) camera.

According to an example embodiment, a correlated double sampling (CDS) circuit may include a correction circuit configured to receive an input pixel signal from a column line, correct the input pixel signal, and output the corrected pixel signal; and a comparator configured to generate a comparison result based on the corrected pixel signal and a ramp signal. The correction circuit may include a first node through which the input pixel signal is received from the column line, a second node through which the corrected pixel signal is output, a first capacitor connected between the first and second nodes, and one or more metal lines disposed adjacent to the first capacitor such that the first capacitor and the one or more metal lines form one or more parasitic capacitors, the first capacitor and the one or more parasitic capacitors being configured to generate the corrected pixel signal by removing noise from the input pixel signal.

The comparator may include a first input terminal and a second input terminal, the first input terminal being connected to the second node and being configured to receive the corrected pixel signal, the second input terminal being configured to receive the ramp signal, the comparator being configured to compare the corrected pixel signal with the ramp signal and output the comparison result based on the comparing.

The one or more metal lines may include a first metal line and a second metal line, the first and second metal lines being adjacent to the first capacitor such that first ends of the first and second metal lines, respectively, are connected to a first end of the first capacitor, the first end of the first capacitor being connected to the first node.

The one or more parasitic capacitors may include a first parasitic capacitor formed by the first capacitor and the first metal line, and a second parasitic capacitor formed by the first capacitor and the second metal line.

The first capacitor may include a first end connected to a first electrode and a second end connected to a second electrode, and wherein the first and second metal lines are adjacent to the first capacitor such that the first and second metal lines are each parallel to the first and second ends of the first capacitor.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF THE EMBODIMENTS

Figure 1:
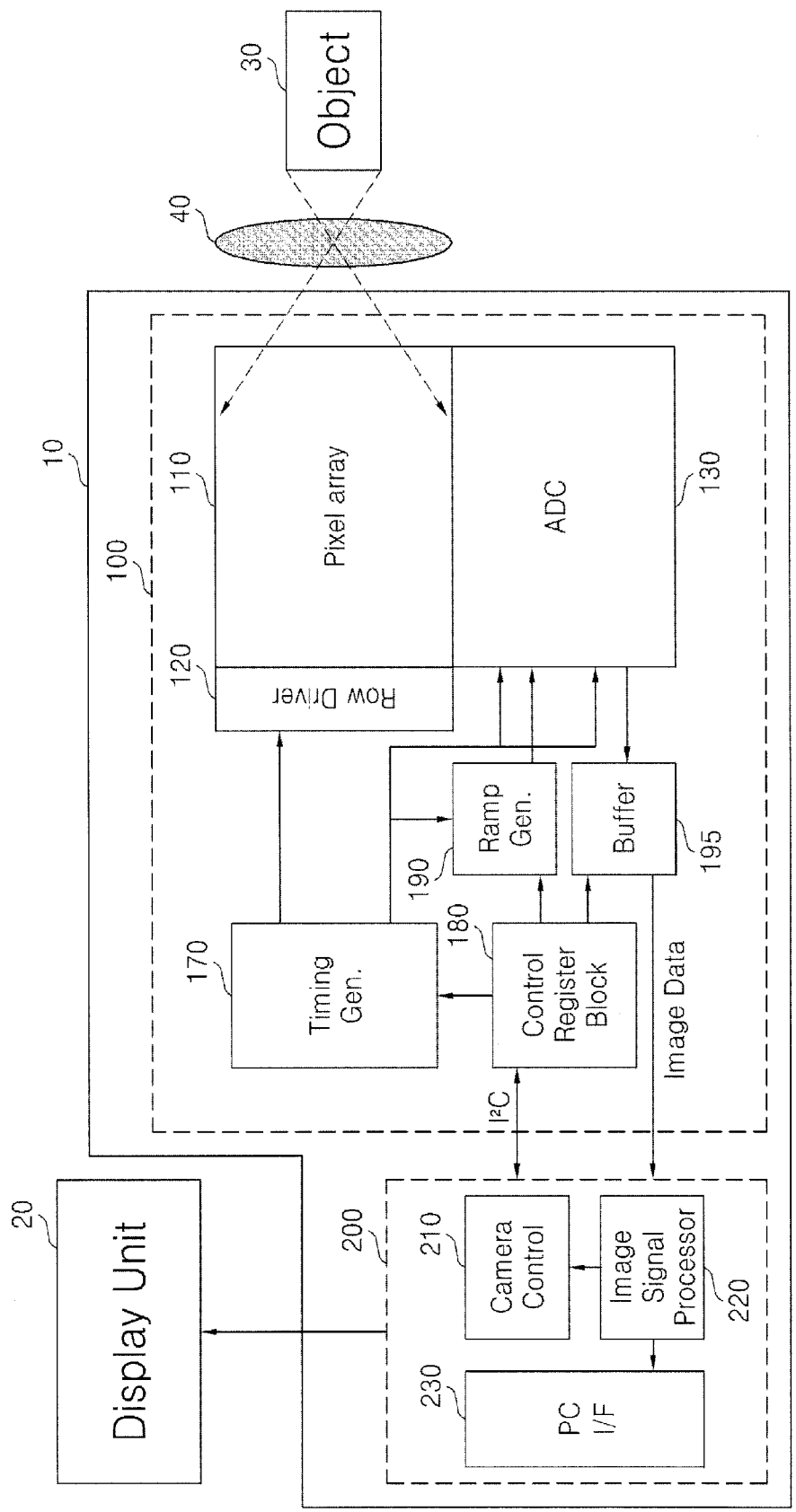
FIG. 1 is a schematic block diagram of an image processing device including an image sensor, according to an example embodiment.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a schematic block diagram of an image processing device 10 including an image sensor 100, according to an example embodiment. Referring to FIG. 1, the image processing device 10 includes the image sensor 100 and an image processor 200.

The image processing device 10 senses an object 30 captured through a lens 40, under control of the image processor 200. The image processor 200 may output an image, which is sensed by the image sensor 100 and output to a display unit 20.

The display unit 20 may be any of various types of devices capable of outputting an image. Examples of the display unit 20 may include a computer, a mobile phone, and other image output terminals. The image processor 200 includes a camera control 210, an image signal processor 220, and a personal computer interface (PC I/F) 230. The camera control 210 controls a control register block 180. According to an example embodiment, the camera control 210 may control the image sensor 100, and particularly, the control register block 180 by using an inter-integrated circuit ($I^2C$).

The image signal processor 220 receives image data that is an output signal of a buffer 195, processes an image to be seen, and then outputs the processed image to the display unit 20 via the PC I/F 230. Although FIG. 1 illustrates that the image signal processor 220 is included in the image processor 200, the location of the image signal processor 220 is variable according to an example embodiment. For example, the image signal processor 220 may be included in the image sensor 100.

The image sensor 100 includes a pixel array 110, a row driver 120, an analog-to-digital converter (ADC) 130, a timing generator 170, the control register block 180, a ramp signal generator 190, and the buffer 195.

The pixel array 110 includes a plurality of photo sensors, e.g., photo diodes or pinned photo diodes. The pixel array 110 senses light by using the plurality of photo sensors, and generates an image signal by transforming the light into an electrical signal.

The timing generator 170 may control operations of the row driver 120, the ADC 130, and the ramp signal generator 190 by supplying a control signal to the row driver 120, the ADC 130, and the ramp signal generator 190.

The control register block 180 may control operations of the ramp signal generator 190, the timing generator 170, and the buffer 195 by supplying a control signal to the ramp signal generator 190, the timing generator 170, and the buffer 195. In this case, the control register block 180 operates under control of the camera control 210. The camera control 210 may be embodied as hardware or software.

The row driver 120 drives the pixel array 110 in units of rows. For example, the row driver 120 may generate a row selection signal. In other words, the row driver 120 may decode a row control signal, e.g., an address signal, which is generated by the timing generator 170, and select at least one row line from among row lines of the pixel array 110, according to the decoded row control signal. Also, the pixel array 110 outputs a reset signal and an image signal from a row selected according to the row selection signal received from the row driver 120, to the ADC 130.

The ADC 130 compares a correlated double sampled signal with a ramp signal received from the ramp signal generator 190, outputs a signal indicating a result of the comparing, counts this signal, and then outputs a result of the counting to the buffer 195. In this case, the ADC 130 may be a column parallel single slope ADC.

The buffer 195 temporarily stores image data received from the ADC 130, and outputs the image data to the image processor 200.

Figure 2:
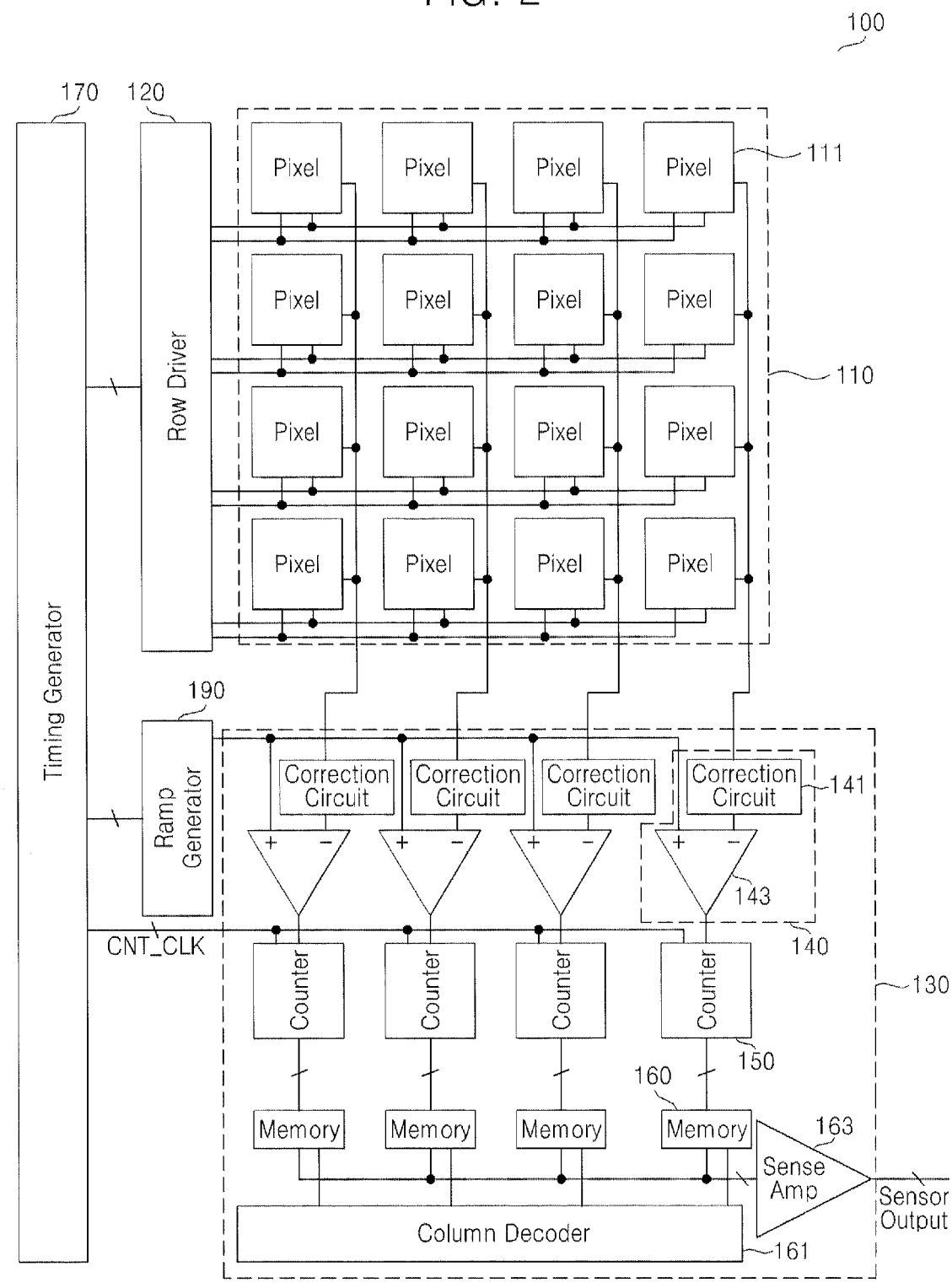
FIG. 2 is a detailed block diagram of the image sensor illustrated in FIG. 1.

FIG. 2 is a detailed block diagram of the image sensor 100 illustrated in FIG. 1. Referring to FIGS. 1 and 2, the image sensor 100 includes the pixel array 110, the row driver 120, the ADC 130, the timing generator 170, and the ramp signal generator 190.

The pixel array 110 may include, for example, a plurality of pixels 111 arranged in a matrix to be connected to a plurality of row lines and a plurality of column lines. Each of the plurality of pixels 111 may include a red filer that passes light of a red wavelength region therethrough, a green filer that passes light of a green wavelength region therethrough, and a blue filter that passes light of a blue wavelength region therethrough.

According to an example embodiment, each of the plurality of pixels 111 may include a cyan filter, a magenta filter, and a yellow filter. The row driver 120 may decode a row control signal, e.g., an address signal, which is generated by the timing generator 170, and select at least one row line from among the row lines of the pixel array 110, according to the decoded row control signal.

The ADC 130 includes a plurality of correlated double sampling (CDS) circuits (e.g., 140), a plurality of counters (e.g., 150), a plurality of memories (e.g., 160), a column decoder 161, and a sense amplifier 163.

The CDS circuit 140 may perform CDS on a pixel signal output from a unit pixel connected to one of the column lines of the pixel array 110, as will be described in detail with reference to FIG. 3 below.

The counter 150 is connected to an output terminal of the comparator 143, and counts a comparison signal Comp and outputs a digital signal, according to a clock signal CNT_CLK received from the timing generator 170. The clock signal CNT_CLK may be generated by a counter controller (not shown) included either in the counter 150 or the timing generator 170, based on a counter control signal generated by the timing generator 170.

The counter 150 may be embodied as up/down counters or bit-wise inversion counters.

The memory 160 may operate according to a memory control signal generated by a memory controller (not shown) included either in the memory 160 or in the timing generator 170, based on a control signal generated by the timing generator 170. The memory 160 may be embodied as static random access memory (SRAM). The memory 160 receives a digital signal from the counter 150, and stores the digital signal. One of the digital signals stored in the memories is amplified by the sense amplifier 163 and is then output as image data, under control of the column decoder 161.

Figure 3:
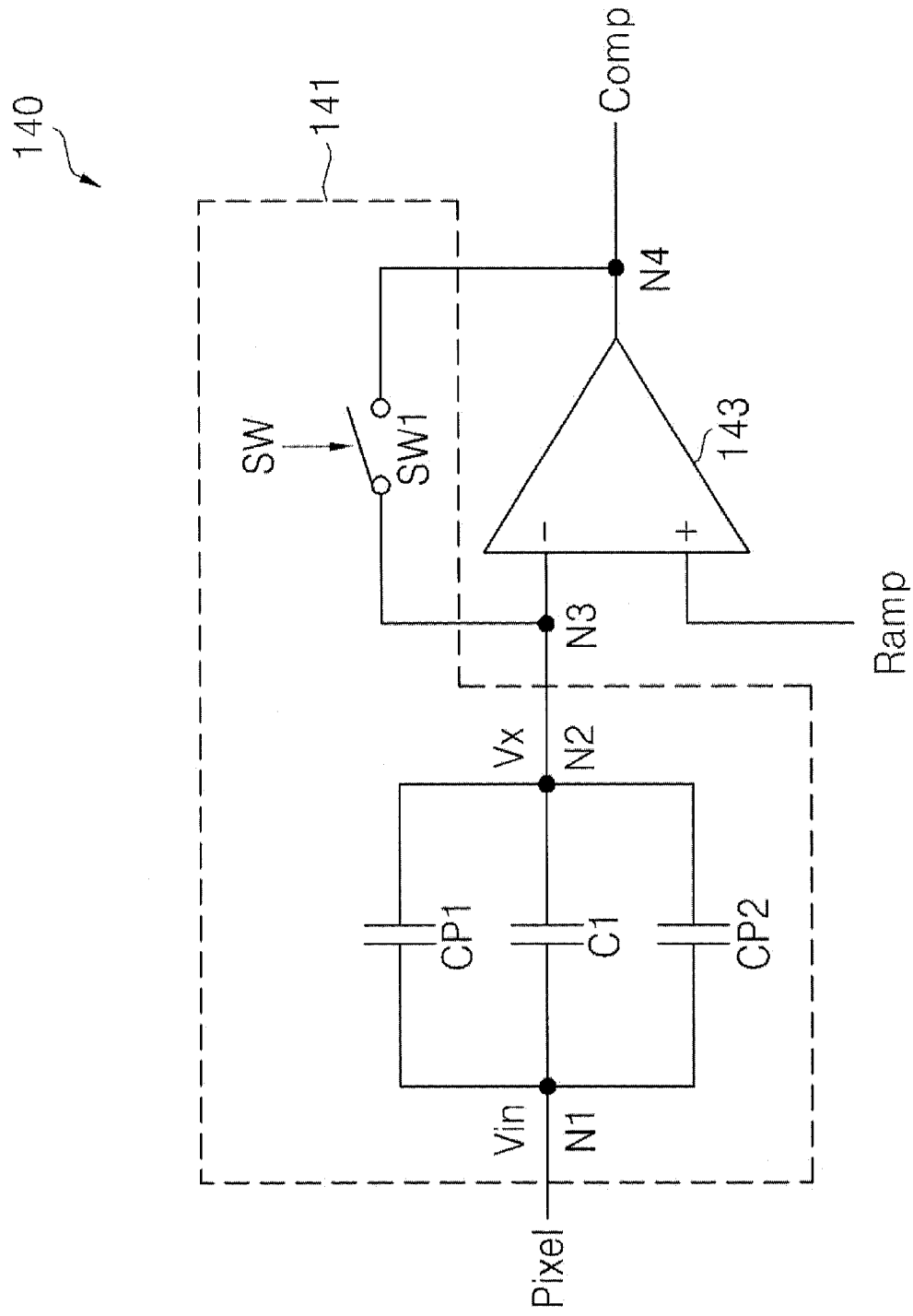
FIG. 3 is a detailed block diagram of a correlated double sampling (CDS) circuit according to at least one example embodiment.

FIG. 3 is a detailed block diagram of a CDS circuit 140 according to at least one example embodiment. Referring to FIGS. 1 to 3, the CDS circuit 140 includes a correction circuit 141 and a comparator 143.

The correction circuit 141 receives a plurality of pixel signals Pixel, which are input via the column lines, via a first node N1, corrects the plurality of pixel signals Pixel, and then outputs corrected pixel signals Vx via a second node N2. To this end, the correction circuit 141 may include a first capacitor C1, at least one other capacitor, e.g., second and/or third capacitors CP1 and CP2, and a first switch SW 1.

The first capacitor C1 blocks direct-current (DC) voltages that may be included in the plurality of pixel signals Pixel so that only corrected voltages may be output. In other words, the first capacitor C1 is connected in series between output terminals of the column lines and input terminal of the comparator 143 by performing DC coupling on the plurality of pixel signals Pixel output via the column lines so as to remove reset noise. The at least one other capacitor, e.g., the second and/or third capacitors CP1 and CP2, may be parasitic capacitors formed in parallel with the first capacitor C1 between the first and second nodes N1 and N2.

The plurality of pixel signals Pixel, the reset noise of which may be removed using the first capacitor C1 and the at least one other capacitor, e.g., the second and third capacitors CP1 and CP2, may be output as the corrected pixel signals Vx. The corrected pixel signals Vx input to the comparator 143 via the second node N2 may be calculated by Equation 1:

$$Vx = Vin(C1 + CP1 + CP2) \qquad (1)$$

Then, a capacitance at the first node N1 increases to (C1+CP1+CP2), and a loss in the plurality of pixel signals Pixel output from the plurality of pixels 111 connected to the column lines may thus be minimized.

The first switch SW1 is connected between a third node N3 and a fourth node N4 to control an operation of the CDS circuit 140. The first switch SW1 may be controlled according to a switch control signal SW. The switch control signal SW may be generated by the timing generator 170.

The comparator 143 is connected to the correction circuit 141 and the ramp signal generator 190. In this case, the correction circuit 141 and the ramp signal generator 190 may be connected to the first input terminal and the second input terminal of the comparator 143, respectively.

The comparator 143 may output a comparison signal Comp corresponding to a result of comparing an output signal of the correction circuit 141 with a ramp signal Ramp generated by the ramp signal generator 190, via an output terminal thereof. In this case, the comparison signal Comp output from the comparator 143 may correspond to the difference between a value of an image signal that varies according to the brightness of external light and a value of a reset signal. The ramp signal Ramp is used to output the difference between the values of the image signal and the reset signal. The ramp signal generator 190 may operate based on a control signal generated by the timing generator 170.

Figure 4:
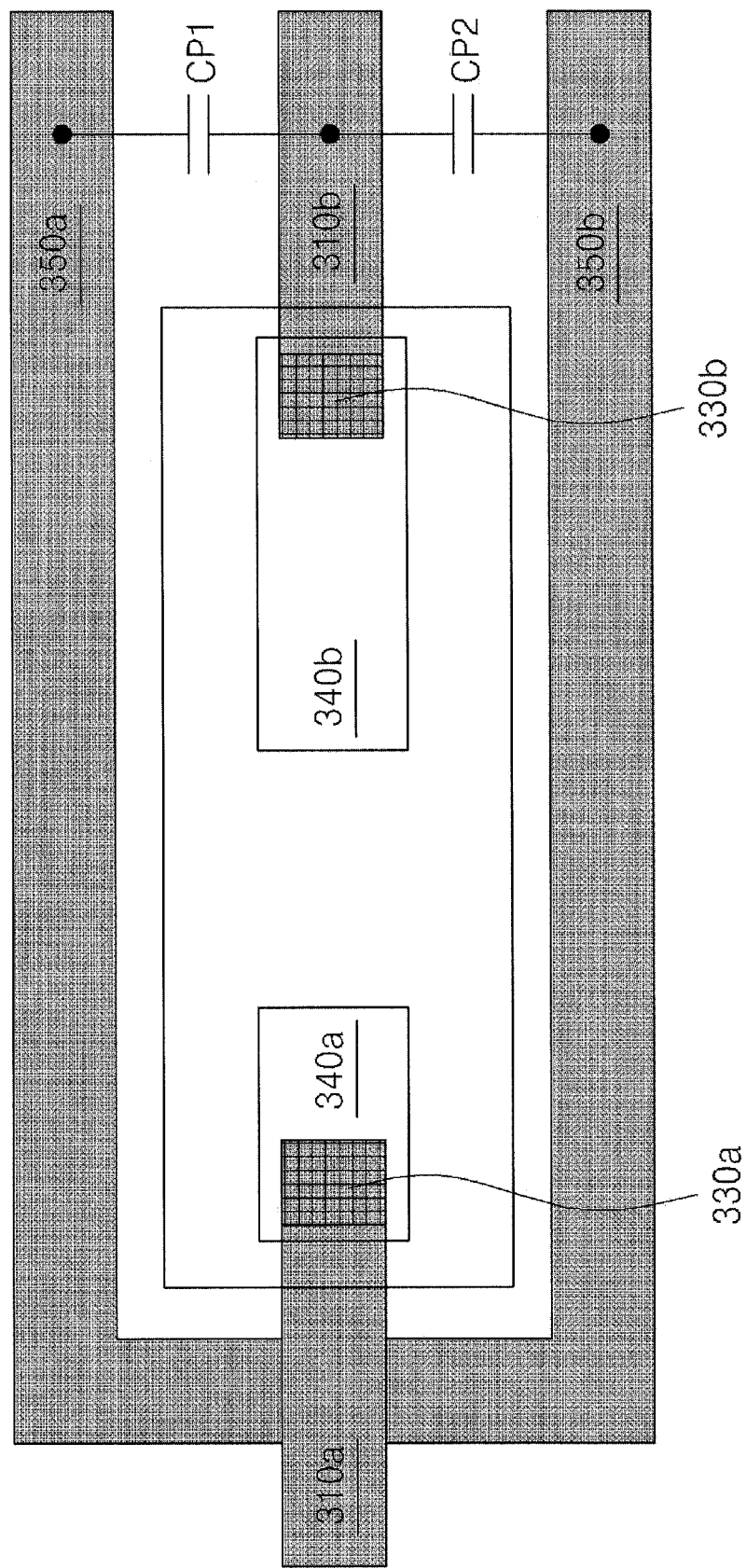
FIG. 4 is a plan view of a correction circuit illustrated in FIG. 3 according to at least one example embodiment.

FIG. 4 is a plan view of the correction circuit 141 illustrated in FIG. 3, according to at least one example embodiment. Referring to FIGS. 1 to 4, the first capacitor C1 of the correction circuit 141 includes a lower electrode 340a and an upper electrode 340b. The lower electrode 340a is connected to one end 310a of the first capacitor C1 via a metal contact 330a, and the upper electrode 340b is connected to the other end 310b of the first capacitor C1 via a metal contact 330b. That is, the lower electrode 340a may receive the pixel signals Pixel via the metal contact 330a, and the upper electrode 340b may output the corrected pixel signals Vx via the metal contact 330b.

The correction circuit 141 includes a first metal line 350a and a second metal line 350b to prevent coupling from occurring between capacitors, which are included in the correction circuit 141 corresponding to a column line adjacent to the first capacitor C1.

The first metal line 350a and the second metal line 350b may be horizontally disposed adjacent to the first capacitor C1. The horizontal disposition of the first and second metal lines 350a and 350b relative to the capacitor C1 may refer to, for example, the first and second metal lines 350a and 350b each being parallel to the ends 310a and 310b of the first capacitor C1. An end of each of the first and second metal lines 350a and 350b may be disposed to be coupled with the one end 310a of the first capacitor C1 which the pixel signals Pixel are received. Then, the second capacitor CP1 may be formed between the other end 310b of the first capacitor C1 and the other end of the first metal line 350a, and the third capacitor CP2 may be formed between the other end 310b of the first capacitor C1 and the other end of the second metal line 350b.

That is, the second and third capacitors CP1 and CP2 included in the correction circuit 141 may be parasitic capacitors formed through the first metal line 350a and the second metal line 350b adjacent to the first capacitor C1.

Thus, the correction circuit 141 may output the pixel signals Pixel received from the plurality of pixels 111 connected to the column lines to the comparator 143 while minimizing a loss in the pixel signals Pixel. Since a loss in the pixel signals Pixel is minimized, a signal-to-noise ratio may be increased and sensitivity may be improved.

Figure 5:
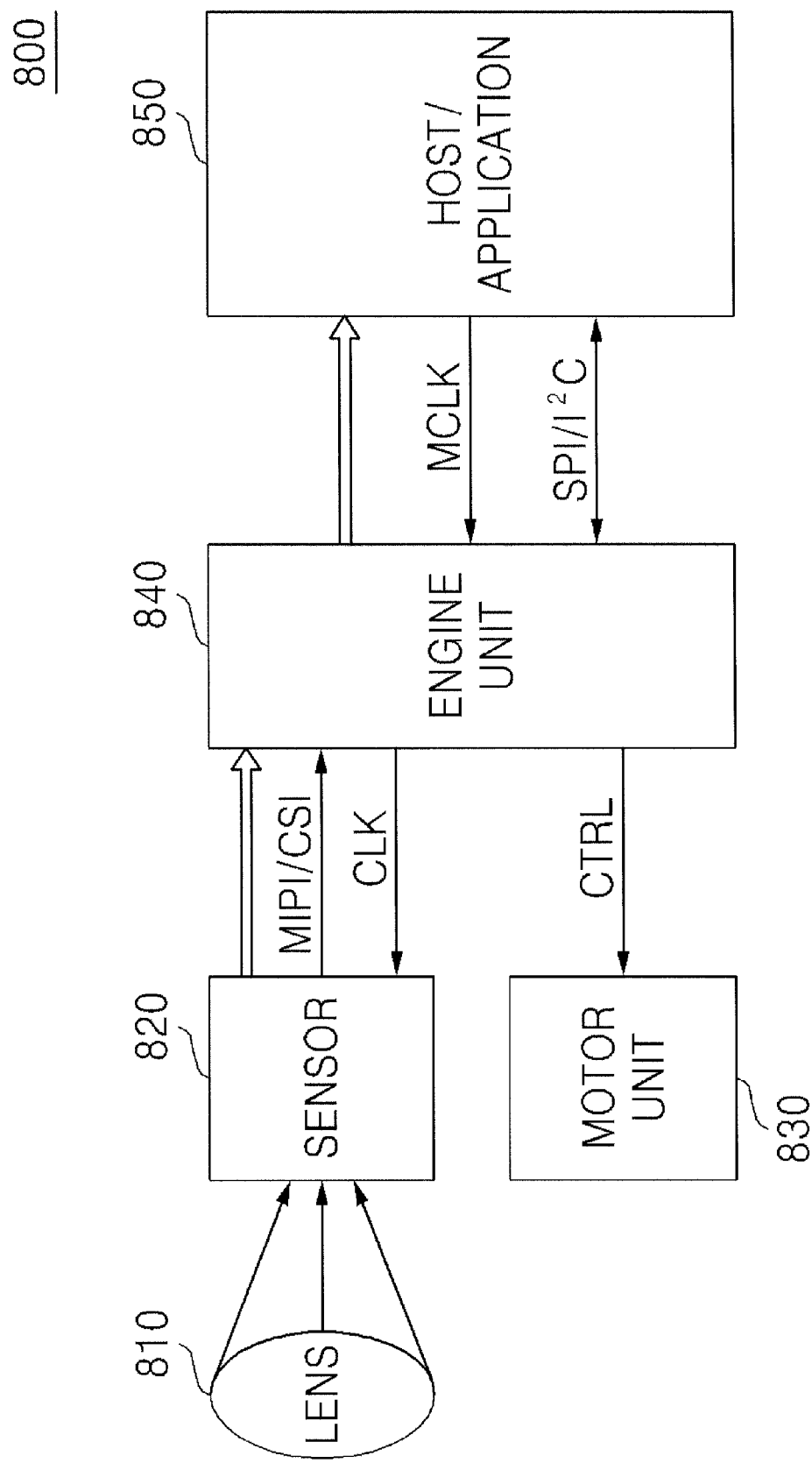
FIG. 5 is a block diagram of a camera system according to an example embodiment.

FIG. 5 is a block diagram of a camera system 800 according to an example embodiment. An example of the camera system 800 may be a digital camera.

Referring to FIG. 5, the camera system 800 may include a lens 810, an image sensor 820, a motor unit 830, and an engine unit 840. The image sensor 820 may be an image sensor as described above with reference to FIGS. 1 through 4 including, for example, the image sensor 100.

The lens 810 focuses incident light onto a light receiving region, e.g., a photo diode, of the image sensor 820. The image sensor 820 generates image data based on the incident light received via the lens 810. The image sensor 820 may provide the image data, based on a clock signal CLK. According to at least one example embodiment, the image sensor 820 may interface with the engine unit 840 via a mobile industry processor interface (MIPI) and/or a camera serial interface (CSI).

The motor unit 830 may adjust focusing of the lens 810 in response to a control signal CTRL received from the engine unit 840 or perform shuttering.

The engine unit 840 controls the image sensor 820 and the motor unit 830. Also, the engine unit 840 may generate luma and chrominance (YUV) data including a distance between the camera system 800 and an object that is to be photographed, a luminance component, a difference between the luminance component and a blue component, and a difference between the luminance component and a red component, based on a distance and/or image data received from the image sensor 820, or may generate compressed data, e.g., Joint Photography Experts Group (JPEG) data. The engine unit 840 may be connected to a host/application 850, and provide the YUV data or the JPEG data to the host/application 850, based on a master clock signal MCLK. Also, the engine unit 840 may interface with the host/application 850 via a serial peripheral interface (SPI) and/or an inter-integrated circuit (I²C).

Figure 6:
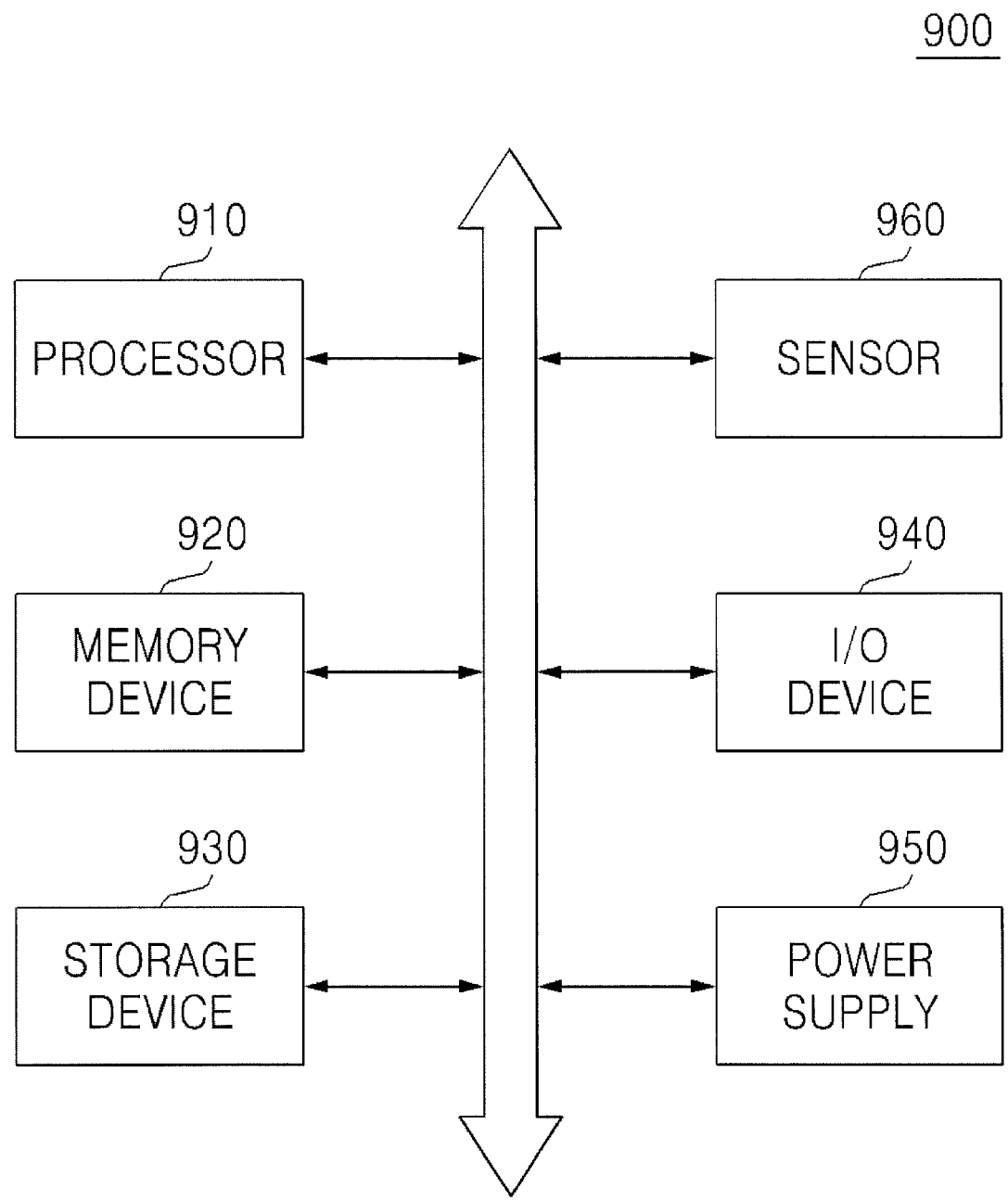
FIG. 6 is a block diagram of a computing system according to an example embodiment.

FIG. 6 is a block diagram of a computing system 900 according to an example embodiment. Referring FIG. 6, the computing system 900 may include a processor 910, a memory device 920, a storage device 930, an input/output device 940, a power supply 950 and an image sensor 960. The image sensor 960 may be the image sensor 100 illustrated in FIGS. 1 through 4.

Although it is not shown in FIG. 6, the computing system 900 may further include ports for communicating with a video card, a sound card, a memory card, a universal serial bus (USB) device or other electronic device.

The processor 910 may perform particular calculations or tasks. According to some embodiments, the processor 910 may include a micro-processor, or a central processing unit (CPU). The processor 910 may communicate with the memory device 920, the storage device 930 and the input/output device 940 via an address bus, a control bus and a data bus.

According to some embodiments, the processor 910 may be connected to an expansion bus such as a peripheral component interconnect (PCI) bus.

The memory device 920 may store data necessary for operations of the computing system 900. For example, the memory device 920 may be embodied as any of a dynamic random access memory (DRAM), a mobile DRAM, a static random access memory (SRAM), a phase change RAM (PRAM), a ferroelectric RAM (FRAM), a resistive RAM (RRAM or ReRAM), a magnetic RAM (MRAM), or a combination thereof.

The storage device 930 may include a solid state drive (SSD), a hard disk drive (HDD), and/or a compact disk-read only memory (CD-ROM).

The input/output device 940 may include an input device such as a keyboard, a keypad or mouse, and an output device such as a printer or a display.

The power supply 950 may provide an operating voltage necessary for operations of the computing system 900.

The image sensor 960 may be connected to the processor 910 and communicate with the processor 910 via the buses or other communication link. The image sensor 960 may be integrated as one chip with the processor 910 or as a separate chip.

The computing system 900 may be any one of all kind of computing systems using the image sensor 960. For example, the computing system 900 may include a digital camera, a mobile phone, a personal digital assistant (PDA), a portable multimedia player (PMP), or a smart phone.

Figure 7:
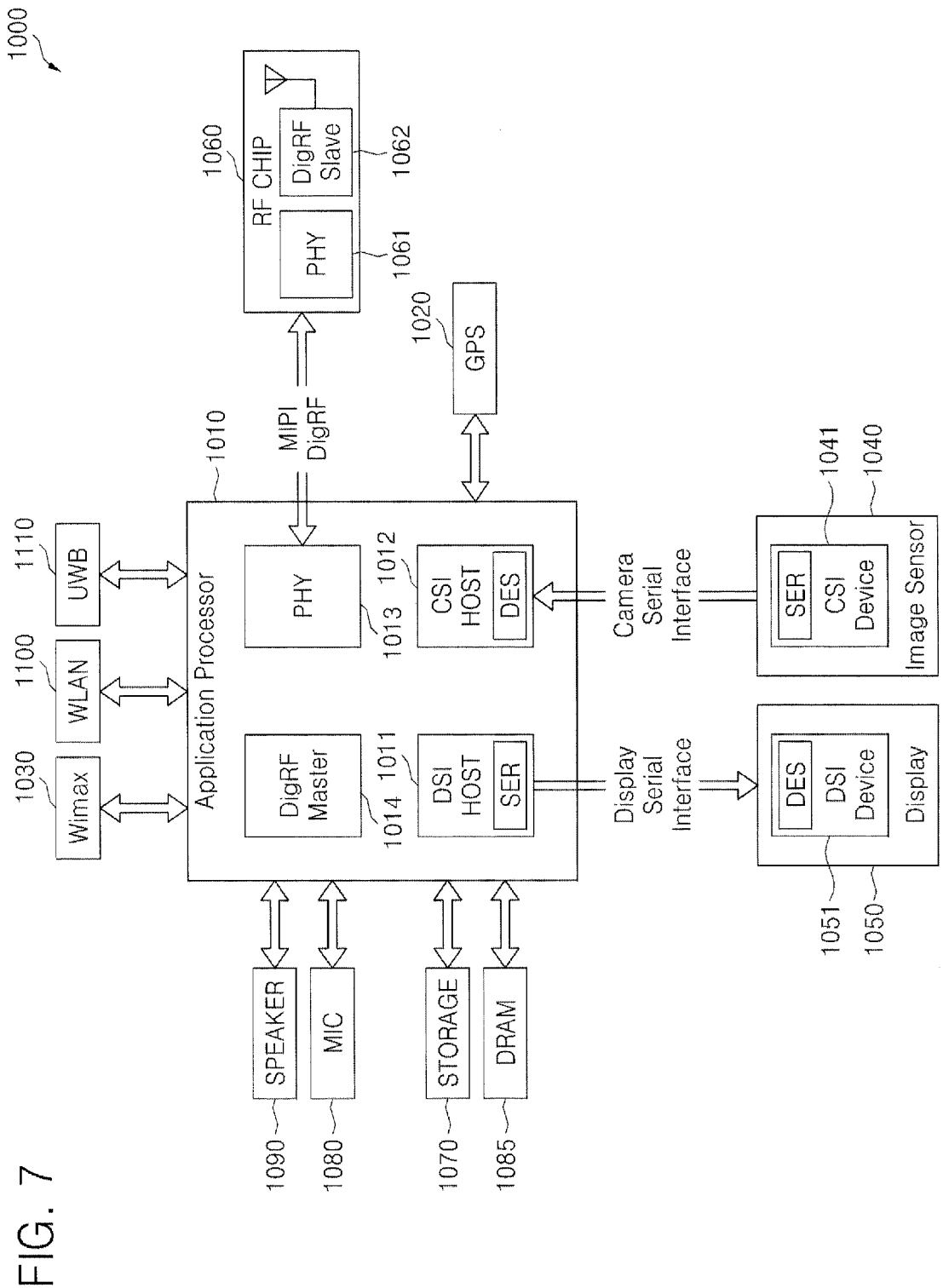
FIG. 7 is a block diagram of interfaces used in the computing system illustrated in FIG. 6.

FIG. 7 is a block diagram of interfaces used in the computing system illustrated in FIG. 6.

The computing system 1000 may be implemented as a data processing apparatus that can use or support the MIPI interface. The computing system 1000 may include an application processor 1010, an image sensor 1040, and a display 1050.

A CSI host 1012 included in the application processor 1010 performs serial communication with a CSI device 1041 included in the image sensor 1040 through CSI. For example, an optical de-serializer (DES) may be implemented in the CSI host 1012, and an optical serializer (SER) may be implemented in the CSI device 1041. The image sensor 1040 may be the image sensor 100 illustrated in FIGS. 1 through 4.

A DSI host 1011 included in the application processor 1010 performs serial communication with a DSI device 1051 included in the display 1050 through DSI. For example, an optical serializer (SER) may be implemented in the DSI host 1011, and an optical de-serializer (DES) may be implemented in the DSI device 1051.

The computing system 1000 may also include a radio frequency (RF) chip 1060 which communicates with the application processor 1010. A physical layer (PHY) 1013 of the computing system 1000 and a PHY 1061 of the RF chip 1060 communicate data with each other according to a MIPI (Mobile Industry Processor Interface) DigRF standard. The AP 1010 may further include a DigRF master 1014 controlling data transmission according to a MIPI DigRF of PHY 1013.

The computing system 1000 may further include a global positioning system (GPS) 1020, a storage device 1070, a microphone 1080, a DRAM 1085 and a speaker 1090. The computing system 1000 may communicate using Ultra WideBand (UWB) 1110, Wireless Local Area Network (WLAN) 1100, or Worldwide Interoperability for Microwave Access (Wimax) 1030, etc. However, the structure and interface of the computing system 1000 illustrated in FIG. 7 are just examples and, according to an example embodiment, the structure and interface of the computing system 1000 are not limited to the arrangement illustrated in FIG. 7.

A CDS circuit according to an example embodiment may minimize a signal loss by using a parasitic capacitor. The CDS circuit may also minimize a loss in a pixel signal, thereby increasing a signal-to-noise ratio and sensitivity.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A correlated double sampling (CDS) circuit comprising:
a correction circuit configured to receive an input pixel signal through a first node via a column line, correct the input pixel signal, and output the corrected pixel signal through a second node; and
a comparator including a first input terminal and a second input terminal, the first input terminal being connected to the second node and being configured to receive the corrected pixel signal, and the second input terminal configured to receive a ramp signal, the comparator being configured to compare the corrected pixel signal with the ramp signal and output a comparison signal indicating a result of the comparing,
wherein the correction circuit includes,
a first capacitor connected between the first and second nodes,
one or more metal lines disposed adjacent to the first capacitor, and
at least one other capacitor, the at least one other capacitor being a parasitic capacitor resulting from parasitic capacitance between the first capacitor and the metal line.

2. The CDS circuit of claim 1, wherein the one or more metal lines includes a first metal line and a second metal line, the first and second metal lines being horizontally disposed adjacent to the first capacitor, and wherein first ends of the first and second metal lines, respectively, are connected to a first end of the first capacitor, the first end of the first capacitor being connected to the first node.

3. The CDS circuit of claim 2, wherein the at least one other capacitor includes a second capacitor and a third capacitor,
wherein the second capacitor is formed between a second end of the first capacitor and a second end of the first metal line, the second end of the first capacitor being connected to the second node, and
the third capacitor is formed between the second end of the first capacitor and a second end of the second metal line.

4. The CDS circuit of claim 1, wherein the first capacitor is connected in series between an output terminal of the column line and the first input terminal of the comparator.

5. The CDS circuit of claim 1, wherein the correction circuit is configured to perform direct-current (DC) coupling on the input pixel signal received via the column line so as to remove reset noise.

6. The CDS circuit of claim 1, wherein the input pixel signal includes at least one from among a reset signal and an image signal.

7. An image sensor comprising:
a pixel array including a plurality of pixels;
a corrected double sampling (CDS) circuit configured to perform CDS on an input pixel signal being respectively received from unit pixels connected to a column line of the pixel array, and output a result of the performing; and
a ramp signal generator configured to generate a ramp signal,
wherein the CDS circuit includes,
a correction circuit configured to receive the input pixel signal through a first node via the column line, correct the input pixel signal, and then output the corrected pixel signal through a second node; and
a comparator including a first input terminal and a second input terminal, the first input terminal being connected to the second node and being configured to receive the corrected pixel signal, and the second input terminal configured to receive the ramp signal, the comparator being configured to compare the corrected pixel signal with the ramp signal and output a comparison signal indicating a result of the comparing,
wherein the correction circuit includes,
a first capacitor connected between the first and second nodes;
one or more metal lines disposed adjacent to the first capacitor; and at least one other capacitor, the at least one other capacitor being a parasitic capacitor resulting from parasitic capacitance between the first capacitor and the metal line.

8. The image sensor of claim 7, wherein the one or more metal lines include a first metal line and a second metal line, the first and second metal lines being horizontally disposed adjacent to the first capacitor, and wherein first ends of the first and second metal lines, respectively, are connected to a first end of the first capacitor, the first end of the first capacitor being connected to the first node.

9. The image sensor of claim 8, wherein the at least one other capacitor includes a second capacitor and a third capacitor,
wherein the second capacitor is formed between a second end of the first capacitor and a second end of the first metal line, the second end of the first capacitor being connected to the second node, and
wherein the third capacitor is formed between the second end of the first capacitor and a second end of the second metal line.

10. The image sensor of claim 7, further comprising:
an analog-to-digital converter configured to receive an output signal of the CDS circuit and the ramp signal,
wherein the CDS circuit is included inside the analog-to-digital converter.

11. The image sensor of claim 10, wherein the analog-to-digital converter is a column parallel single slope analog-to-digital converter.

12. An image processing device comprising:
the image sensor of claim 7; and
a processor configured to control operations of the image sensor.

13. The image processing device of claim 12, wherein the image processing device is a mobile phone.

14. The image processing device of claim 12, wherein the image processing device is a tablet personal computer.

15. The image processing device of claim 12, wherein the image processing device is a digital single-lens reflex (DSLR) camera.

16. A correlated double sampling (CDS) circuit comprising:
a correction circuit configured to receive an input pixel signal from a column line, correct the input pixel signal, and output the corrected pixel signal; and
a comparator configured to generate a comparison result based on the corrected pixel signal and a ramp signal,
the correction circuit including,
a first node through which the input pixel signal is received from the column line,
a second node through which the corrected pixel signal is output,
a first capacitor connected between the first and second nodes, and
one or more metal lines disposed adjacent to the first capacitor such that the first capacitor and the one or more metal lines form one or more parasitic capacitors, the first capacitor and the one or more parasitic capacitors being configured to generate the corrected pixel signal by removing noise from the input pixel signal.

17. The CDS circuit of claim 16, wherein the comparator includes a first input terminal and a second input terminal, the first input terminal being connected to the second node and being configured to receive the corrected pixel signal, the second input terminal being configured to receive the ramp signal, the comparator being configured to compare the corrected pixel signal with the ramp signal and output the comparison result based on the comparing.

18. The CDS circuit of claim 16, wherein the one or more metal lines includes a first metal line and a second metal line, the first and second metal lines being adjacent to the first capacitor such that first ends of the first and second metal lines, respectively, are connected to a first end of the first capacitor, the first end of the first capacitor being connected to the first node.

19. The CDS circuit of claim 18, wherein the one or more parasitic capacitors includes a first parasitic capacitor formed by the first capacitor and the first metal line, and a second parasitic capacitor formed by the first capacitor and the second metal line.

20. The CDS circuit of claim 19, wherein the first capacitor includes a first end connected to a first electrode and a second end connected to a second electrode, and wherein the first and second metal lines are adjacent to the first capacitor such that the first and second metal lines are each parallel to the first and second ends of the first capacitor.

* * * * *